United States Patent
Nave

(10) Patent No.: US 7,283,157 B2
(45) Date of Patent: Oct. 16, 2007

(54) AUTOMATIC LEVEL CONTROL (ALC) FOR VIDEO SIGNALS

(75) Inventor: James Edward Nave, Denton, TX (US)

(73) Assignee: Texas Instruments Incorporated, Dallas, TX (US)

( * ) Notice: Subject to any disclaimer, the term of this patent is extended or adjusted under 35 U.S.C. 154(b) by 477 days.

(21) Appl. No.: 10/769,100

(22) Filed: Jan. 30, 2004

(65) Prior Publication Data

US 2004/0183953 A1 Sep. 23, 2004

Related U.S. Application Data

(60) Provisional application No. 60/444,349, filed on Jan. 30, 2003.

(51) Int. Cl.
*H04N 17/02* (2006.01)
*H04N 5/52* (2006.01)
(52) U.S. Cl. .................. 348/194; 348/678; 348/691
(58) Field of Classification Search ............... 348/194, 348/678, 682, 684, 691, 695, 697, 257
See application file for complete search history.

(56) References Cited

U.S. PATENT DOCUMENTS

| | | | | |
|---|---|---|---|---|
| 4,424,528 A | * | 1/1984 | Karlock et al. | 348/575 |
| 4,667,242 A | * | 5/1987 | Hagino | 348/678 |
| 5,157,493 A | * | 10/1992 | Hamon et al. | 348/682 |
| 5,339,114 A | * | 8/1994 | Lagoni et al. | 348/673 |
| 5,771,077 A | * | 6/1998 | Jennes et al. | 348/571 |
| 6,172,716 B1 | * | 1/2001 | Karlock | 348/575 |
| 6,219,107 B1 | * | 4/2001 | Renner et al. | 348/678 |
| 2004/0150755 A1 | * | 8/2004 | Nave | 348/678 |

* cited by examiner

*Primary Examiner*—Victor R. Kostak
(74) *Attorney, Agent, or Firm*—J. Dennis Moore; W. James Brady, III; Frederick J. Telecky, Jr.

(57) ABSTRACT

Disclosed are methods and systems for automatic level control (ALC) in a video signal processing system. The new ALC of the invention takes into account the gain applied to the video signal, such as that provided by an associated automatic gain control (AGC). Methods and systems of the invention use present gain control values and previous gain control values in quickly converging to a new offset control value.

12 Claims, 3 Drawing Sheets

AUTOMATIC LEVEL CONTROL (ALC) FOR VIDEO SIGNALS

RELATED APPLICATIONS

This application claims priority based on Provisional Patent Application 60/444,349, filed Jan. 30, 2003. This application and the aforementioned provisional application have a common inventor and are assigned to the same entity. This application is also related to patent application, Ser. No. 10/760,602, and to patent application, Ser. No. 10/748,966, which are herein incorporated in their entirety for all purposes by this reference.

TECHNICAL FIELD

The invention relates to signal processing methods and systems. More particularly, the invention relates to methods and systems for automatic level control (ALC) in processing video signals.

BACKGROUND OF THE INVENTION

The reproduction of electronic video images involves the transmission of a waveform known as a video signal. Various types of video signals, such as for example composite video, S-video, and component video, have certain shared characteristics. In general, the video signal includes both video image display information and associated synchronizing information. A graphical representation of a generic video signal 110 known in the arts is shown in FIG. 1. As shown in the example, the video information is generally in the form of a signal having a black reference level 112, and a higher level representing white 114. The continuum of levels 116 between the black level 112 and the white level 114 is then used to represent degrees of gray. The synchronizing information used in formatting the signal display includes vertical and horizontal display alignment and color decoding information. The lowest value of the synchronizing signal is referred to as the "sync tip" 120. The synchronizing pulses 118 are positioned in portions of the signal 110 that do not contain video display information, that is, below the black level 112 to prevent disruption of the video image display. This is referred to as the "blank level" 124. The synchronizing pulses 118 shown in this example have a reference level at the blank level 124.

The video signal waveform 110 from the sync tip level 120 to the white level 114 used in this example has a nominal peak-to-peak amplitude of 1V. The "front porch" 130 refers to the portion of the video signal 110 that occurs between the end of the active video interval 128 and the falling/leading edge of the horizontal sync pulse 118. The "back porch" 126 refers to the portion of the video signal 110 that occurs between the rising/trailing edge of the horizontal sync pulse 118 and the beginning of the active video interval 128.

In video signal processing, automatic level control (ALC) is commonly used to maintain the offset level or brightness of the video signal. In a typical ALC implementation, the offset applied to the video signal is automatically adjusted until the difference between the target back-porch level (also known as blanking level 600) and the measured back-porch level is driven to zero at the output of the video system. Similarly, automatic gain control (AGC) is commonly used to maintain the amplitude or contrast of the video signal. In a typical AGC implementation, the gain applied to the video signal is automatically adjusted until the ratio of the target sync-height to the measured sync-height is driven to unity.

One problem encountered in the arts is that the back-porch level referred to the input of the gain control stage is typically not guaranteed to be zero. Therefore, a step change in the gain applied to the video signal can cause a corresponding step change in the back-porch level referred to the output of the video system. Restoring the desired back-porch level after a step change in the gain may require multiple iterations of a recursively filtered ALC algorithm. The net effect is the appearance of an offset transient whenever there is a step change in the gain.

Offsets may be applied to either the coarse analog offset stage or the fine digital offset stage of the signal processing system. Similarly, gains may be applied to either the coarse analog gain stage or the fine digital gain stage of the signal processing system. Assuming for the purpose of clarifying and simplifying the description, that both the coarse analog offset and the coarse analog gain remain constant, the fine digital offset and fine digital gain may be discussed individually. The same approach toward adjusting the offset may alternatively be applied to either the coarse analog offset or the fine digital offset, or to both.

It is known in the arts to make adjustments to an offset control value by finding the difference between a desired target back porch value and an actual measured back porch value. The difference may be multiplied by a filter coefficient, and the result added to the immediately preceding fine offset control value to obtain a new fine offset control value. Herein denominated the "classical approach," this technique may be expressed, $$O_F[n] = O_F[n-1] + \alpha^*(L_{NOM} - N_{BP})/G_p \qquad \text{[Equation 1]},$$

where $O_F[n]$ is a new fine offset control value, $O_F[n-1]$ is the immediately preceding fine offset control value, $\alpha$ is a first-order recursive filter coefficient, $L_{NOM}$ is the desired or target back porch level referred to the signal output, $N_{BP}$ is the mean measured back porch value and $G_p$ is the gain applied between a fine offset stage and the signal output where the back porch level is measured.

A problem with the classical approach to automatic level control (ALC) is that changes in the gain applied to the video signal, for example by an AGC technique, can cause offset transient. Offset transient occurs when a relatively large gain change, in this case fine gain, is made in the video signal processing system with the result that the required new fine offset control value $O_F[n]$ is dramatically different from the immediately preceding fine offset control value, $O_F[n-1]$. Since the classical approach does not consider gain when setting the new fine offset control value $O_F[n]$, it can take numerous iterations of the commonly used ALC techniques to arrive at a desirable new fine offset control value $O_F[n]$. These difficulties are still more acute when the ALC is applied relatively infrequently, such as at the frame rate, making signal anomalies more problematic than they might be if occurring at shorter intervals, such as at the line rate.

FIG. 2 (prior art) and FIG. 3 (prior art) help to illustrate the problem of offset transient using the classical approach. Assume, for the purposes of illustration, an arbitrary step gain change in a signal processing system from 1.25 to 1.0 (y-axis), as shown FIG. 2. Further assume that the classical ALC approach is applied at a frame rate. Plotting the change in the target back porch level over the difference of the mean measured back porch level and the synch tip level, $(L_{NOM}/(N_{BP}-N_{ST}))$, shows that the change can be accomplished in relatively few frames (x-axis), the bulk of the transition being completed within about 40 frames. Referring now to FIG. 3, the difference between the target back porch level and the measured back porch level ($L_{NOM}-N_{BP}$) is plotted relative to the number of frames (x-axis). It can be seen that the gain change depicted in FIG. 2 results in a sudden and dramatic departure of the measured back porch level from the target back porch level. Moreover, it takes a significant number of frames, i.e., iterations of the classical ALC approach in this example, to reach the desired target back porch level.

Due to these and other problems, it would be useful and desirable in the arts to provide improved ALC methods and systems capable of providing quickly converging and accurate automatic level control dynamically adjusted for applied gain.

SUMMARY OF THE INVENTION

In carrying out the principles of the present invention, in accordance with preferred embodiments thereof, methods and systems are provided for automatic level control (ALC) in a video signal processing system by controlling the signal level responsive to gain variations.

According to one aspect of the invention, techniques are described for taking gain into account when adjusting a video signal reference level by applying a new offset control value.

According to preferred embodiments of the invention, methods are disclosed in which the back porch level is monitored at the video system output and a mean back porch is computed. The difference between the mean back porch and target back porch level is used, along with the immediately preceding fine offset control value and present gain value, in order to determine a new fine offset control value.

According to other aspects of the invention, the steps are reiterated at selected intervals, such as the line rate or frame rate of the video output signal.

According to other aspects of the invention, the steps may be applied to analog processes and/or digital processes in the video signal processing system.

According to another aspect of the invention, the methods may be determined or described by the relationship:

$$O_F[n]=(1-\alpha)*[N_{BP}/G_P-(N_{BP}/G_P-O_F[n-1])*(a/b+G_F[n])/(a/b+G_F[n-1])]+\alpha*[L_{NOM}/G_P-(N_{BP}/G_P-O_F[n-1])*(a/b+G_F[n])/(a/b+G_F[n-1])],$$
[Equation 2].

Wherein: $O_F[n]$ is a new fine offset control value; $O_F[n-1]$ is the immediately preceding fine offset control value; $\alpha$ is an ALC recursive filter coefficient according to the system; $G_F[n]$ is a fine gain control value as determined by an AGC; $G_F[n-1]$ is the immediately preceding fine gain control value; a is the y-intercept, and b is the slope of the linear fine gain control equation of the AGC; $L_{NOM}$ is the target back porch level value; $N_{BP}$ is the mean of digital samples of the actual measured back porch value; and $G_P$ is the gain applied between a fine offset stage and the signal output.

According to yet another aspect of the invention, a system for automatic level control (ALC) of a video signal includes means for measuring the back porch of the video signal, determining the mean back porch level over a selected interval, and while dynamically adjusting for gain, applying a new offset control value for positioning the back porch at or near a target value.

The invention provides technical advantages including but not limited to providing accurate ALC adjustments that may be applied to a video signal concurrently taking into consideration the existing gain level. These and other features, advantages, and benefits of the present invention will become apparent to one of ordinary skill in the art upon careful consideration of the detailed description of representative embodiments of the invention in connection with the accompanying drawings.

BRIEF DESCRIPTION OF THE DRAWINGS

The present invention will be more clearly understood from consideration of the following detailed description and drawings in which.

Figure 1:
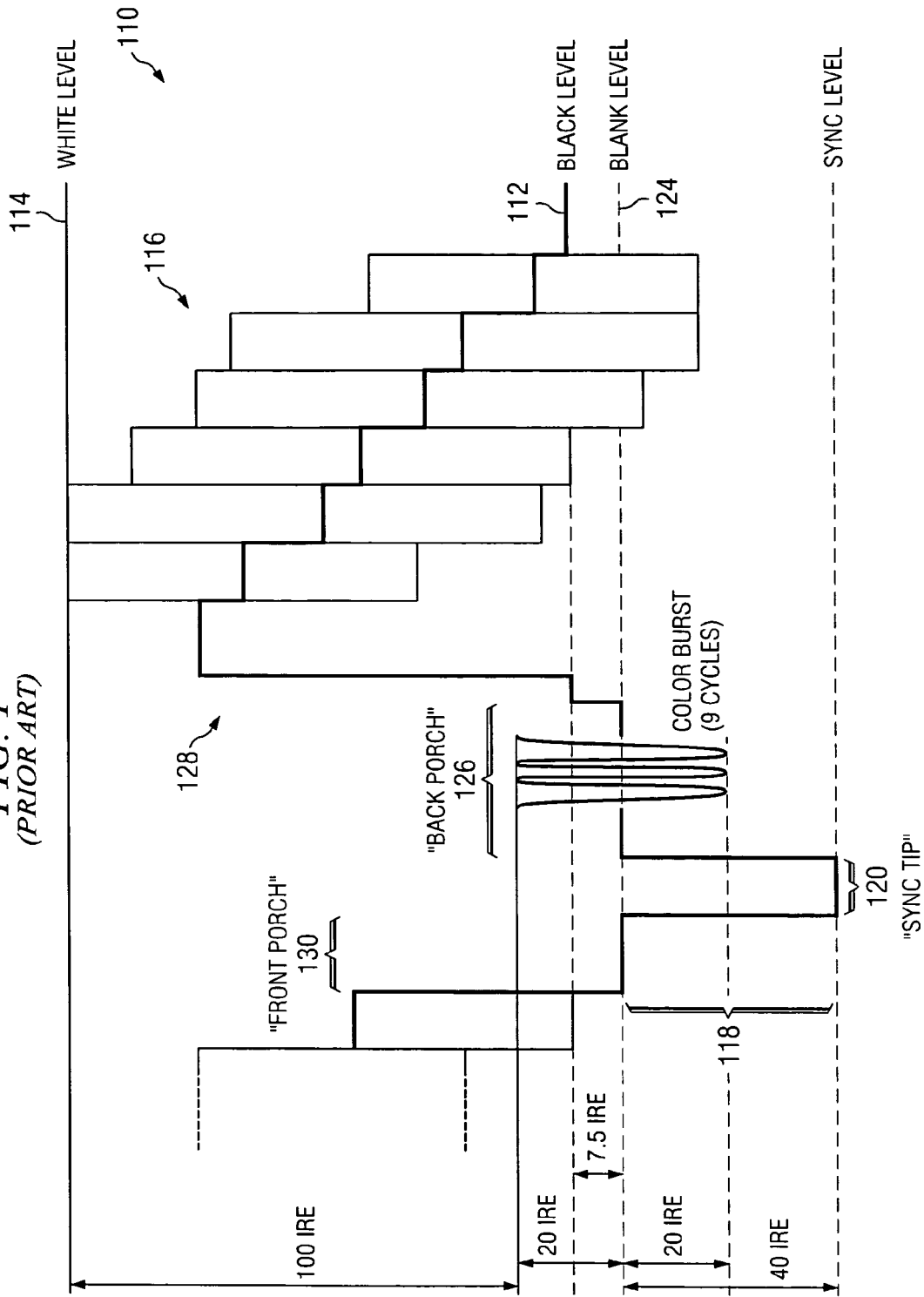
FIG. 1 (prior art) is an example of a representative video signal familiar in the arts.
Figure 2:
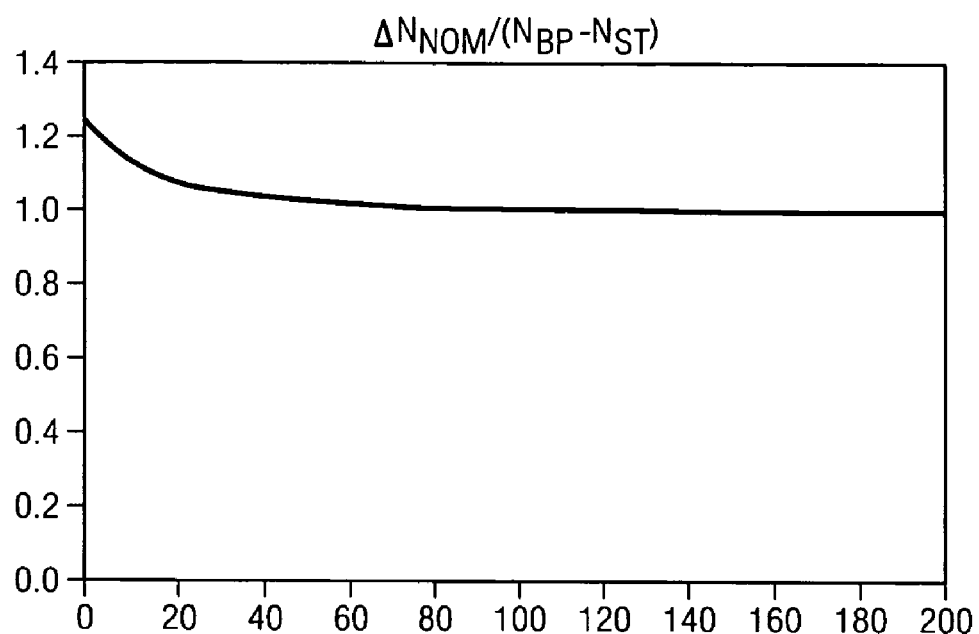
FIG. 2 (prior art) is a depiction of an example of the response to a step gain change in a representative video signal familiar in the arts.

References in the detailed description correspond to like references in the figures unless otherwise noted. Like numerals refer to like parts throughout the various figures. Descriptive and directional terms used in the written description such as upper, lower, left, right, etc., refer to the drawings themselves as laid out on the paper and not to physical limitations of the invention unless specifically noted. The drawings are not to scale, and some features of embodiments shown and discussed are simplified or amplified for illustrating the principles, features, and advantages of the invention.

DETAILED DESCRIPTION OF PREFERRED EMBODIMENTS

In general, the automatic level control (ALC) of the invention takes into account the gain of the system, such as that provided by an associated automatic gain control (AGC). Many AGC systems and methods are known in the arts and may be used without departure from the ALC techniques of the invention. The examples and preferred embodiments described herein refer to video signal applications, however, it should be understood by those familiar with the arts that numerous other applications would be well served by use of the principles of the invention.

A new fine offset control value in a video system according to a preferred embodiment of the invention may be described by, $$O_F[n]=(1-\alpha)*[N_{BP}/G_P-(N_{BP}/G_P-O_F[n-1])*(a/b+G_F[n])/(a/b+G_F[n-1])]+\alpha*[L_{NOM}/G_P-(N_{BP}/G_P-O_F[n-1])*(a/b+G_F[n])/(a/b+G_F[n-1])],$$
[Equation 2], where:

$O_F[n]$ is a new fine offset control value, preferably expressed as a 12-bit digital value;

$O_F[n-1]$ is the immediately preceding fine offset control value;

$\alpha$ is an ALC recursive filter coefficient according to the system;

$G_F[n]$ is the fine gain control value, as selected by an AGC method, for example, as disclosed in the referenced co-pending application, preferably the fine gain control value is expressed as a 12-bit digital value;

$G_F[n-1]$ is the immediately preceding fine gain control value;

a is the y-intercept, and b is the slope of the linear fine gain control equation of the AGC;

$L_{NOM}$ is the target back porch level value;

$N_{BP}$ is the mean of digital samples of the actual measured back porch value; and $G_P$ is the gain applied between a fine offset stage and the signal output.

The expression of Equation 2 may be manipulated and rearranged to provide the alternative expression, $$O_F[n]=N_{BP}/G_P-(N_{BP}/G_P-O_F[n-1])*[(a/b+G_F[n])/(a/b+ G_F[n-1])]+\alpha(L_{NOM}-N_{BP})/G_P \quad [\text{Equation 3}].$$

This expression may be simplified further by assuming that the y-intercept value a is equal to zero:

$$O_F[n]=N_{BP}/G_P-(N_{BP}/G_P-O_F[n-1])*G_F[n]/G_F[n-1]+\alpha*(L_{NOM}-N_{BP})/G_P \quad [\text{Equation 4}].$$

It should be understood that the y-intercept has been set to zero for the sake of convenience in this example. Any y-intercept may be used without departure from the invention so long as a constant value is selected. The application of the principles of methods and systems conforming to a topology described by Equation 4 are further described herein. Preliminarily, it should be noted that if the fine gain control value is constant, i.e., in cases where $G_F[n]=G_F[n-1]$, the description of the new fine offset control value reverts back to the classical approach given in Equation 1.

Since the gain value that gave rise to the immediately preceding offset is unchanged, the new fine offset control value is then equal to the immediately preceding fine offset control value plus the product of the filter coefficient and the difference between the target back-porch level ($L_{NOM}$) and the mean measured back-porch level ($N_{BP}$) divided by the gain $G_P$ applied between a fine offset stage and the signal output where the back porch level is measured.

In cases where the fine gain control value has changed, i.e., $G_F[n]$ does not equal $G_F[n-1]$, Equation 1 does not accurately describe the attributes of an optimum new fine offset control value $O_F[n]$. It should be appreciated that the approach of Equation 1 does not take the preceding, $G_F[n-1]$, and new fine gain control values $G_F[n]$ into account. The approach of Equations 2 through 4 has been developed to describe a new approach to automatic level control, in which the effect of the fine gain change is taken into account. It should be appreciated by those skilled in the arts that the approach of dynamically adjusting the fine offset control value $O_F[n]$ based on the fine gain control value $G_F[n]$ may also be used alternatively or concurrently in a system or subsystem for adjusting the coarse offset control value $O_C[n]$ based on the coarse gain control value $G_C[n]$, by making suitable modifications to equations 2 through 4.

Figure 4:
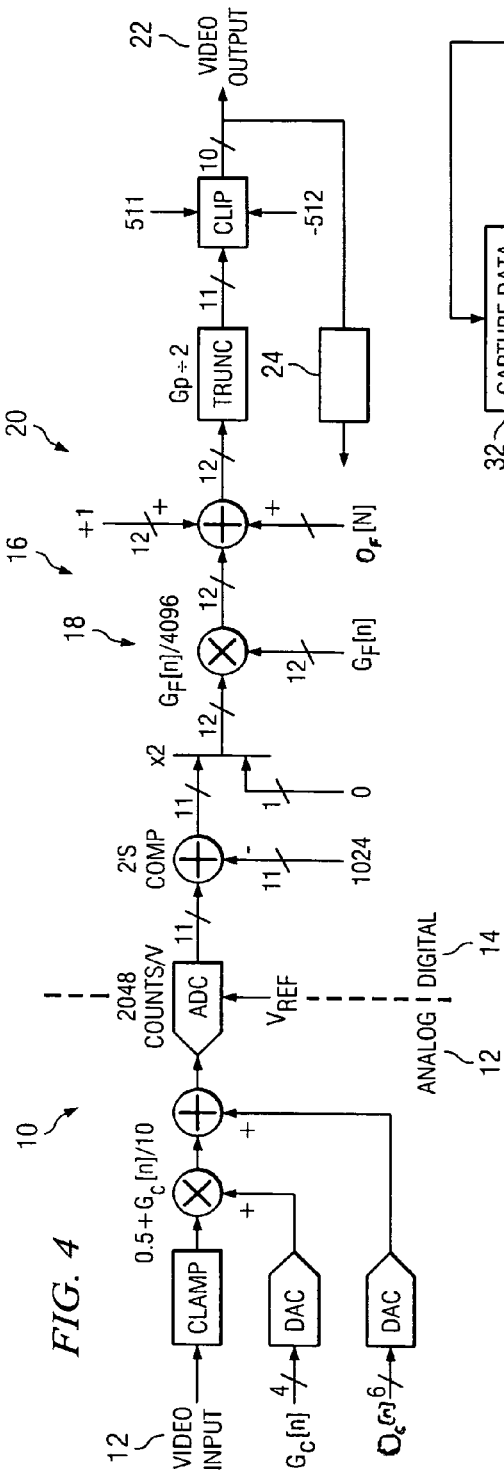
FIG. 4 is a block diagram showing an example of a video signal processing system illustrating the operation of exemplary embodiments of the ALC of the invention.

FIG. 4 is a block diagram showing an example of a video system 10 using a preferred embodiment of the invention. An analog video input signal 12 is received by the system 10 and is converted as known in the arts into a digital signal 14 for processing by digital circuitry 16. In order to facilitate processing and display processes, a gain 18 is applied to the signal 14 using AGC methods and systems described elsewhere, such as for example, those described in the co-pending applications incorporated herein in their entirety by reference. Level correction 20 is provided using a fine offset control value $O_F[n]$ in order to ensure that the proper levels are maintained in order to provide a video output signal 22 for display or other use by additional circuitry (not shown).

The offset level correction 20 relies on the capture of data relative to the video output signal 22 and adjustment 24 of the offset control value $O_F[n]$ based on existing gain conditions.

Figure 3:
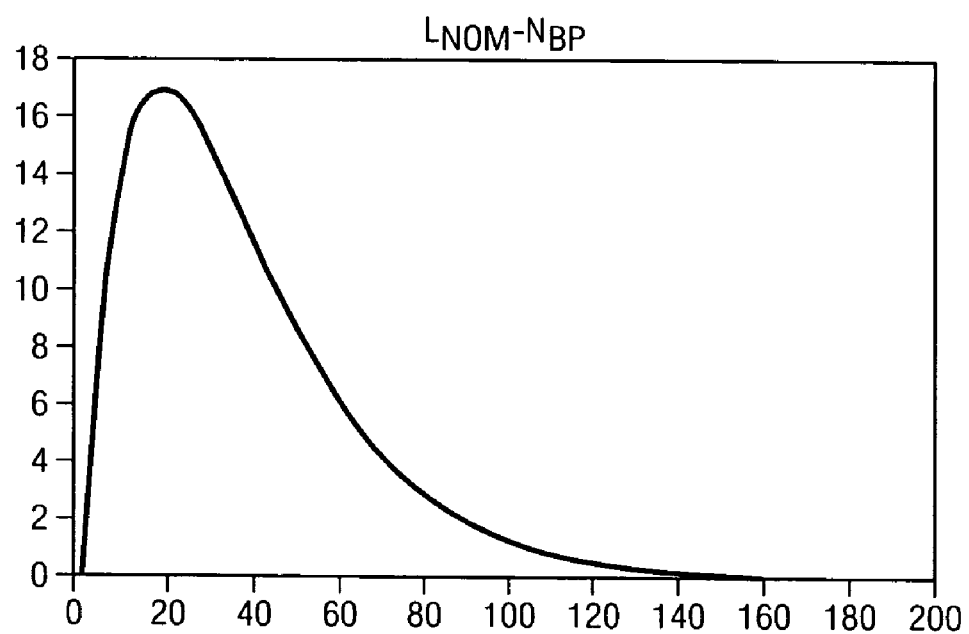
FIG. 3 (prior art) is a depiction of an example of the effects of the gain change shown in FIG. 2 when using a known ALC technique with a representative video signal familiar in the arts.

A process flow diagram illustrating an example of an overview of offset adjustment 24 steps in a preferred embodiment of the invention is shown in FIG. 3. Using the frame rate interval as an example, the measured back-porch level may be captured for each horizontal line of an entire video frame, as indicated in step 32. This may be accomplished by sampling the back porch, for example, 16 samples per line, and averaging the results. Next, the mean back-porch level $N_{BP}$ for that frame is calculated 34. As shown at step 36, the difference between the target back-porch level ($L_{NOM}$) and the mean measured back-porch level ($N_{BP}$) is used to determine the new fine offset control value $O_F[n]$, as shown for example, by Equation 4.

$$O_F[n]=N_{BP}/G_P-(N_{BP}/G_P-O_F[n-1])*G_F[n]/G_F[n-1]+ \alpha*(L_{NOM}-N_{BP})/G_P.$$

Equation 4 is a first-order recursive filter having a filter coefficient of $\alpha$. The filter coefficient value $\alpha$ is preferably a power-of-2 fraction (e.g. 1, ½, ¼ or ⅛) so that the multiplication can be performed without introducing any additional quantization error by using a simple shift operation. Although the preferred embodiment describes the use of the invention at the frame rate of the video signal, longer or shorter intervals may also be used. It should be appreciated that the methods described converge quickly, permitting updates to be performed at less frequent intervals while remaining invisible in the video image.

Figure 5:
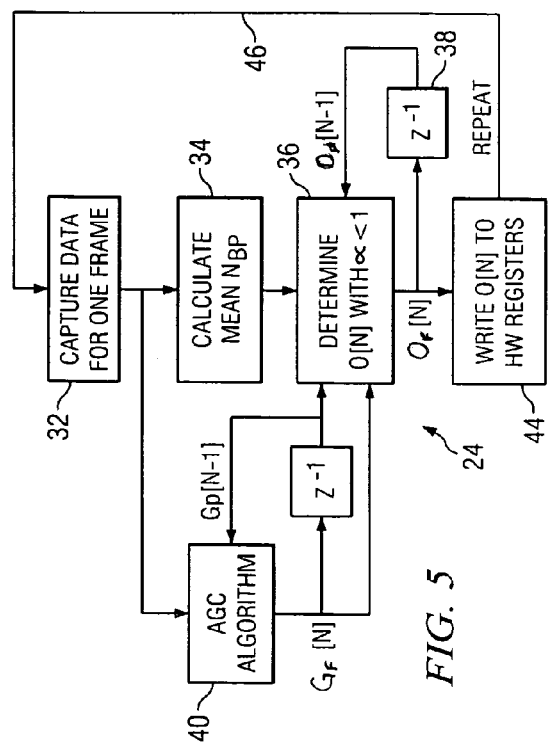
FIG. 5 is a process flow diagram depicting an example of methods and systems for ALC according to the invention.

Further referring primarily to FIG. 5, as shown at box 38, the new fine offset control value $O_F[n]$ is determined using the previous fine offset control value $O_F[n-1]$, obtained from the signal. Additionally, the fine digital gain control value $G_F[n]$, preferably determined using a suitable automatic gain control (AGC) algorithm 40, as well as the immediately preceding fine digital gain control value $G_F[n-1]$, are used to adjust the new fine offset control value $O_F[n]$ to account for the present fine gain. The new fine offset control value $O_F[n]$ is then applied 44 to the video output. As indicated by arrow path 46, the steps are preferably reiterated at a selected interval, such as in this example, the frame rate of the video signal.

It should be understood by those skilled in the arts that the invention may also be applied, with suitable modification, to controlling the signal level at the analog stage 12 (FIG. 4) of a signal processing system. As described, essentially, the preceding offset control value is used, taking gain into account, to maintain the reference level at its previous value; and the new offset value, taking gain into account, is used to further adjust the reference level toward the target value.

Thus, the invention provides new systems and methods for automatic level control (ALC) in signal processing. The automatic level control of the invention converges quickly and accurately by taking signal gain level into account. The invention may be readily applied to processing video signals in their various forms. Examples of video systems where the invention may be used include, but are not limited to; NTSC, M-NTSC, NTSC-J, NTSC 4.43, PAL, M-PAL, B, D, G, H, or N-PAL, SECAM, B, D, G, H, K, K1, or L-SECAM. While the invention has been described with reference to certain illustrative embodiments, the description of the methods and devices described are not intended to be construed in a limiting sense. Various modifications and combinations of the illustrative embodiments as well as other advantages and embodiments of the invention will be apparent to persons skilled in the art upon reference to the description and claims.

I claim:

1. An automatic level control (ALC) method for use in a video signal processing system, the method comprising the steps of:

determining the mean back porch level ($N_{BP}$) over a selected interval of the video signal;

selecting a target back-porch level ($L_{NOM}$);

determining a new fine offset control value $O_F[n]$, described by the relationship;

$$O_F[n]=(1-\alpha)*[N_{BP}/G_P-(N_{BP}/G_P-O_F[n-1])*(a/b+G_F[n])/(a/b+G_F[n-1])]+\alpha*[L_{NOM}/G_P-(N_{BP}/G_P-O_F[n-1])*(a/b+G_F[n])/(a/b+G_F[n-1])],$$

wherein;

$O_F[n]$ is the new fine offset control value;

$O_F[n-1]$ is the immediately preceding fine offset control value;

$\alpha$ is a recursive filter coefficient;

$G_F[n]$ is a fine gain control value;

$G_F[n-1]$ is an immediately preceding fine gain control value;

a is the y-intercept, and b is the slope of a linear fine gain control equation;

$L_{NOM}$ is the target back porch level value referred to the signal output;

$N_{BP}$ is the mean measured back porch level value; and $G_P$ is gain applied between a fine offset stage and the signal output.

2. An automatic level control (ALC) method according to claim 1 wherein the steps are performed at a rate slower than the frame rate of the video signal.

3. An automatic level control (ALC) method according to claim 1 wherein the steps are performed at a frame rate of the video signal.

4. An automatic level control (ALC) method according to claim 1 wherein the steps are performed at a rate slower than the frame rate of the video signal.

5. An automatic level control (ALC) method for use in a video signal processing system, the method comprising the steps of:

determining the mean back porch level ($N_{BP}$) over a selected interval of the video signal;

selecting a target back-porch level ($L_{NOM}$);

determining a new fine offset control value $O_F[n]$, described by the relationship;

$$O_F[n]=N_{BP}/G_P-(N_{BP}/G_P-O_F[n-1])*G_F[n]/G_F[n-1]+\alpha*(L_{NOM}-N_{BP})/G_P,$$

wherein;

$O_F[n]$ is the new fine offset control value;

$O_F[n-1]$ is the immediately preceding fine offset control value;

$\alpha$ is a recursive filter coefficient;

$G_F[n]$ is a fine gain control value;

$G_F[n-1]$ is an immediately preceding fine gain control value;

$L_{NOM}$ is the target back porch level value referred to the signal output;

$N_{BP}$ is the mean measured back porch level value; and $G_P$ is gain applied between a fine offset stage and the signal output.

6. An automatic level control (ALC) method according to claim 5 wherein the steps are performed at a rate slower than the frame rate of the video signal.

7. An automatic level control (ALC) method according to claim 5 wherein the steps are performed at a frame rate of the video signal.

8. An automatic level control method (ALC) according to claim 5 wherein the steps are performed at a rate slower than the frame rate of the video signal.

9. An automatic level control (ALC) system comprising:

means for processing an analog video signal with a coarse gain and a coarse offset;

means for processing a digital video signal with a fine gain and a fine offset, where said digital video signal comes from digitizing an output of said means for processing an analog video signal;

means for automatically controlling the level of the digital video signal whereby the back porch level is maintained at a target value by applying a fine offset adapted to the level of fine gain of the video system, thereby eliminating offset transient caused by a step change in the gain.

10. An automatic level control (ALC) system according to claim 9 adapted to operate at intervals less frequent than the frame rate of the video signal.

11. An automatic level control (ALC) system according to claim 9 adapted to operate at the frame rate of the video signal.

12. An automatic level control (ALC) system according to claim 9 adapted to operate at intervals less frequent than the frame rate of the video signal.

* * * * *